(12) United States Patent
Parthasarathy et al.

(10) Patent No.: US 9,601,613 B2
(45) Date of Patent: Mar. 21, 2017

(54) GATE PULLBACK AT ENDS OF HIGH-VOLTAGE VERTICAL TRANSISTOR STRUCTURE

(75) Inventors: Vijay Parthasarathy, Palo Alto, CA (US); Martin H. Manley, Saratoga, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 13/541,965

(22) Filed: Jul. 5, 2012

(65) Prior Publication Data
US 2012/0280314 A1 Nov. 8, 2012

Related U.S. Application Data

(63) Continuation of application No. 12/583,745, filed on Aug. 25, 2009, now Pat. No. 8,222,691, which is a (Continued)

(51) Int. Cl.
*H01L 29/06* (2006.01)
*H01L 29/423* (2006.01)
(Continued)

(52) U.S. Cl.
CPC ...... *H01L 29/7813* (2013.01); *H01L 29/0696* (2013.01); *H01L 29/407* (2013.01); (Continued)

(58) Field of Classification Search
CPC ............... H01L 29/0696; H01L 29/407; H01L 29/4236; H01L 29/42368; H01L 29/7811; H01L 29/7813
(Continued)

(56) References Cited

U.S. PATENT DOCUMENTS 4,908,682 A 3/1990 Takahashi
5,396,097 A 3/1995 Robb et al.
(Continued)

FOREIGN PATENT DOCUMENTS

CN 1469487 1/2004
CN 1806341 7/2006
(Continued)

*Primary Examiner* — Marcos D Pizarro
(74) *Attorney, Agent, or Firm* — The Law Offices of Bradley J. Bereznak

(57) ABSTRACT

In one embodiment, a transistor includes a pillar of semiconductor material arranged in a racetrack-shaped layout having a substantially linear section that extends in a first lateral direction and rounded sections at each end of the substantially linear section. First and second dielectric regions are disposed on opposite sides of the pillar. First and second field plates are respectively disposed in the first and second dielectric regions. First and second gate members respectively disposed in the first and second dielectric regions are separated from the pillar by a gate oxide having a first thickness in the substantially linear section. The gate oxide being substantially thicker at the rounded sections. It is emphasized that this abstract is provided to comply with the rules requiring an abstract that will allow a searcher or other reader to quickly ascertain the subject matter of the technical disclosure.

6 Claims, 12 Drawing Sheets

Related U.S. Application Data continuation of application No. 11/707,820, filed on Feb. 16, 2007, now Pat. No. 7,595,523.

(51) Int. Cl.
    *H01L 29/78*     (2006.01)
    *H01L 29/40*     (2006.01)
    *H01L 21/77*     (2006.01)
    *H01L 29/08*     (2006.01)
    *H01L 29/417*     (2006.01)

(52) U.S. Cl.
    CPC .... *H01L 29/4238* (2013.01); *H01L 29/42368* (2013.01); *H01L 29/7811* (2013.01); *H01L 21/77* (2013.01); *H01L 29/0878* (2013.01); *H01L 29/41741* (2013.01); *H01L 29/4236* (2013.01); *H01L 29/42372* (2013.01); *H01L 2924/13055* (2013.01); *H01L 2924/19043* (2013.01)

(58) Field of Classification Search
    USPC ... 257/328–324, 488, E29.26, E29.262, 331, 257/E29.257
    See application file for complete search history.

(56) References Cited

U.S. PATENT DOCUMENTS

| | | | |
|---|---|---|---|
| 5,408,141 A | 4/1995 | Devore et al. | |
| 5,412,239 A | 5/1995 | Williams | |
| 5,798,554 A | 8/1998 | Grimaldi et al. | |
| 6,084,277 A * | 7/2000 | Disney et al. | 257/401 |
| 6,337,498 B1 | 1/2002 | Hasegawa et al. | |
| 7,345,342 B2 | 3/2008 | Challa et al. | |
| 7,492,212 B1 | 2/2009 | Kadow et al. | |
| 7,554,152 B1 | 6/2009 | Ranucci et al. | |
| 8,022,456 B2 | 9/2011 | Parthasarathy et al. | |
| 8,410,551 B2 | 4/2013 | Parthasarathy et al. | |
| 2005/0001257 A1 | 1/2005 | Schloesser et al. | |
| 2005/0133858 A1 | 6/2005 | Banerjee et al. | |
| 2005/0167749 A1* | 8/2005 | Disney | 257/341 |
| 2008/0197396 A1 | 8/2008 | Parthasarathy | |
| 2008/0197397 A1 | 8/2008 | Parthasarathy et al. | |
| 2008/0197406 A1 | 8/2008 | Parthasarathy et al. | |

FOREIGN PATENT DOCUMENTS

| | | |
|---|---|---|
| CN | 101246908 | 7/2011 |
| DE | 4309764 | 9/1994 |
| EP | 1073123 | 1/2001 |
| EP | 1168455 | 1/2002 |
| EP | 1959496 | 8/2008 |
| EP | 1959497 | 8/2008 |
| GB | 2309336 | 1/1997 |
| JP | 56038867 | 4/1981 |
| JP | 57010975 | 1/1982 |
| JP | 57012557 | 1/1982 |
| JP | 57012558 | 1/1982 |
| JP | 60064471 | 4/1985 |
| JP | 1238037 | 9/1989 |
| JP | 3211771 | 9/1991 |
| JP | 4107877 | 4/1992 |
| JP | 4107867 | 7/1992 |
| JP | 6120510 | 4/1994 |
| JP | 6196630 | 6/1994 |
| JP | 6224426 | 8/1994 |
| JP | 07045817 | 2/1995 |
| JP | 08046193 | 2/1996 |
| JP | 09008295 | 1/1997 |
| JP | 05160408 | 6/1997 |
| JP | 09213951 | 8/1997 |
| JP | 9266311 | 10/1997 |
| JP | 10256545 | 9/1998 |
| JP | 2000012854 | 1/2000 |
| JP | 2001168329 | 6/2001 |
| JP | 2002043562 | 2/2002 |
| JP | 2002170955 | 6/2002 |
| JP | 2004087520 | 3/2004 |
| JP | 2004200540 | 7/2004 |
| JP | 2006032420 | 2/2006 |
| JP | 2006351930 | 12/2006 |
| WO | 9735346 | 9/1997 |
| WO | 9934449 | 7/1999 |
| WO | 0033385 | 6/2000 |
| WO | 0241402 | 5/2002 |
| WO | 02099909 | 12/2002 |
| WO | 03023861 | 3/2003 |

* cited by examiner

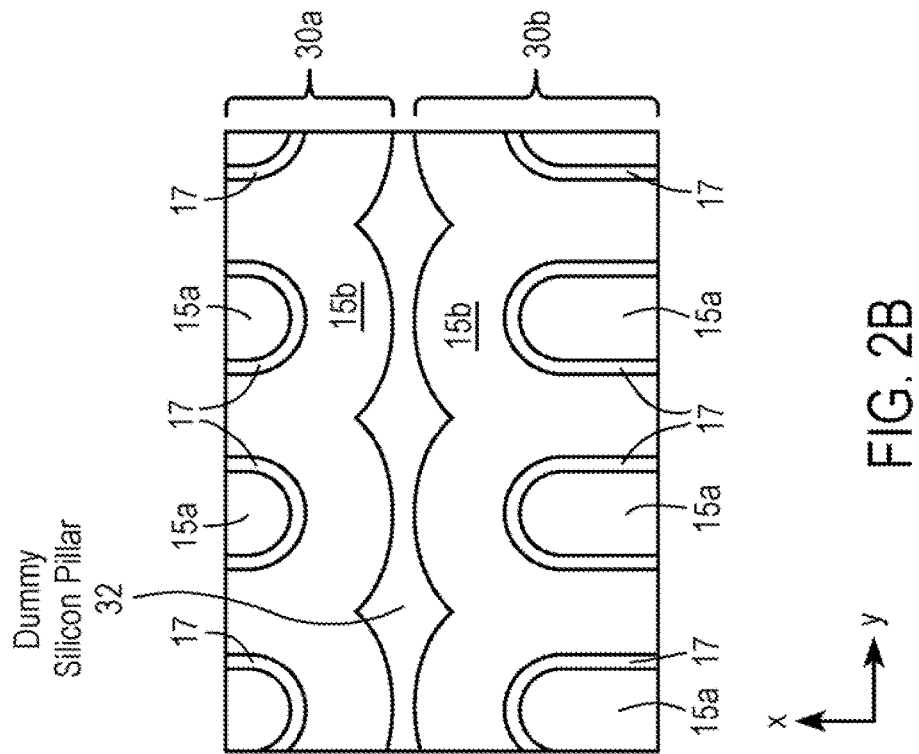
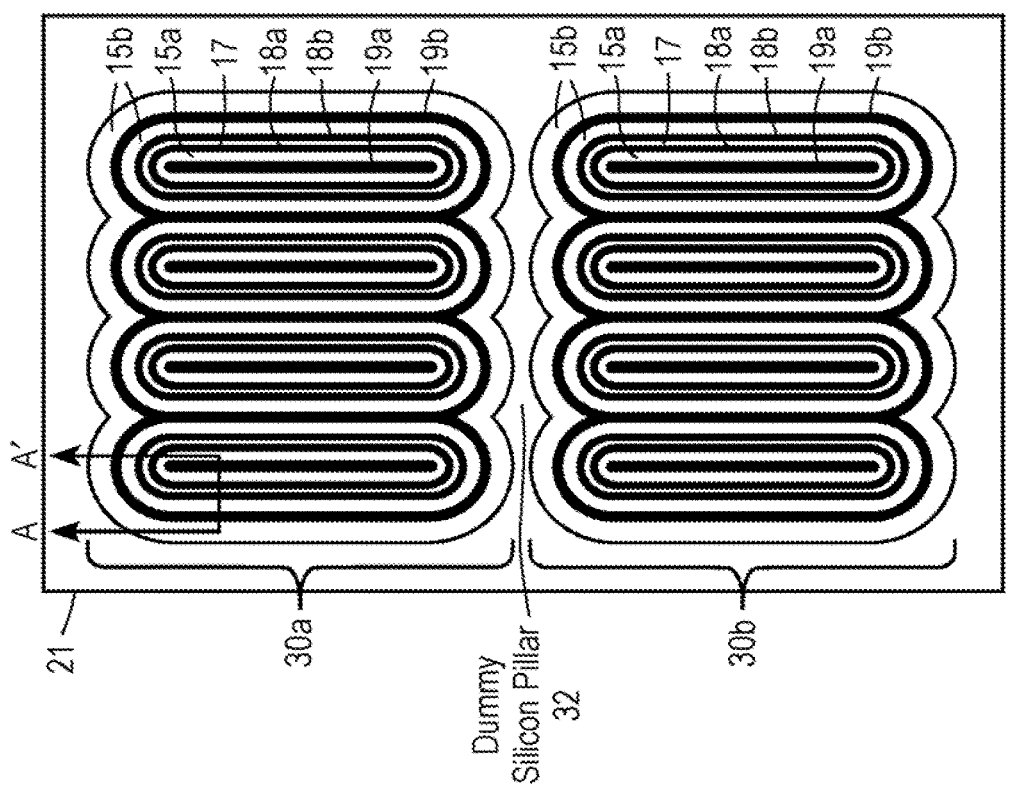
FIG. 2A
FIG. 2B

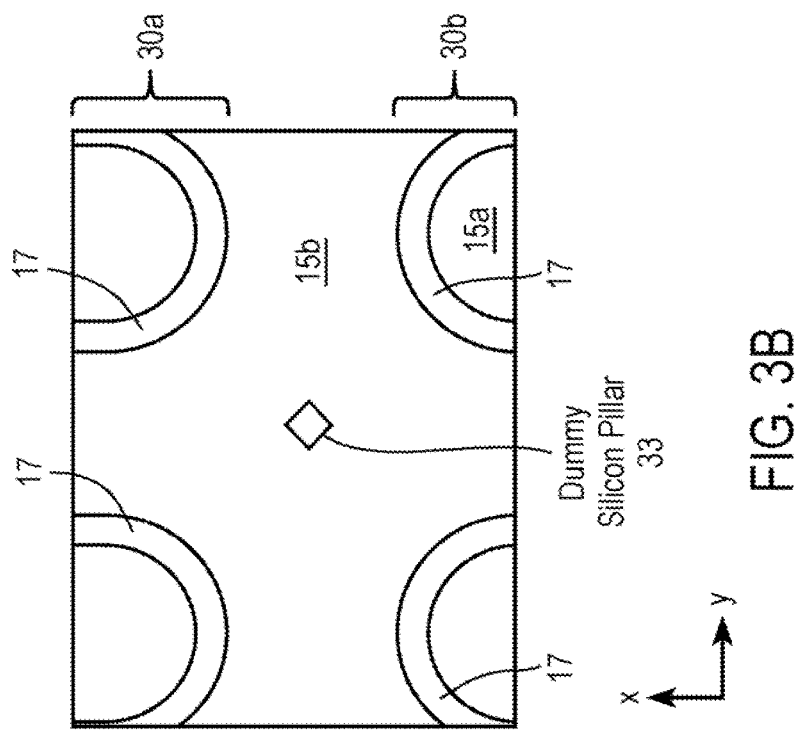
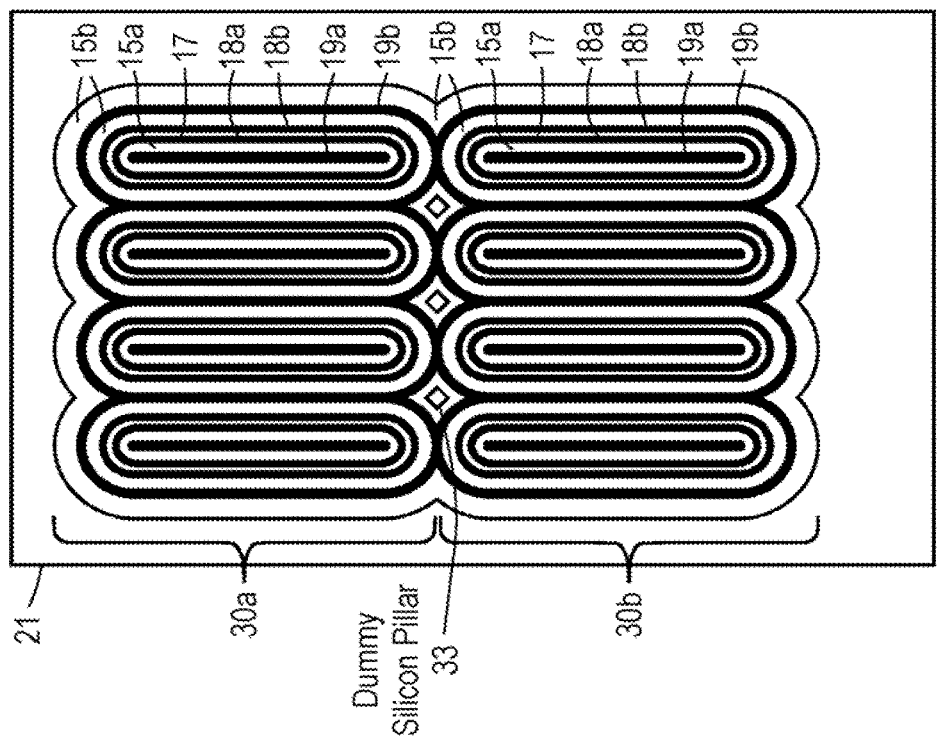
FIG. 3B
FIG. 3A

GATE PULLBACK AT ENDS OF HIGH-VOLTAGE VERTICAL TRANSISTOR STRUCTURE

This application is a continuation of application Ser. No. 12/583,745, filed Aug. 25, 2009, now U.S. Pat. No. 8,222, 691, issued Jul. 17, 2012, which is a continuation of application Ser. No. 11/707,820, filed Feb. 16, 2007, now U.S. Pat. No. 7,595,523, issued Sep. 29, 2009, entitled, "Gate Pullback at Ends of High-Voltage Vertical Transistor Structure", both of which are assigned to the assignee of the present application.

TECHNICAL FIELD

The present disclosure relates to semiconductor device structures and processes for fabricating high-voltage transistors.

BACKGROUND

High-voltage, field-effect transistors (HVFETs) are well known in the semiconductor arts. Many HVFETs employ a device structure that includes an extended drain region that supports or blocks the applied high-voltage (e.g., several hundred volts) when the device is in the "off" state. In a conventional vertical HVFET structure, a mesa or pillar of semiconductor material forms the extended drain or drift region for current flow in the on-state. A trench gate structure is formed near the top of the substrate, adjacent the sidewall regions of the mesa where a body region is disposed above the extended drain region. Application of an appropriate voltage potential to the gate causes a conductive channel to be formed along the vertical sidewall portion of the body region such that current may flow vertically through the semiconductor material, i.e., from a top surface of the substrate where the source region is disposed, down to the bottom of the substrate where the drain region is located.

In a traditional layout, a vertical HVFET consists of long continuous silicon pillar structure that extends across the semiconductor die, with the pillar structure being repeated in a direction perpendicular to the pillar length. One problem that arises with this layout, however, is that it tends to produce large warping of the silicon wafer during high temperature processing steps. In many processes, the warping is permanent and large enough to prevent the wafer from tool handling during subsequent processing steps. Additionally, gate oxide weakness in the rounded end portions of the transistor layout can result in gate oxide breakdown voltage and reliability problems.

BRIEF DESCRIPTION OF THE DRAWINGS

The present disclosure will be understood more fully from the detailed description that follows and from the accompanying drawings, which however, should not be taken to limit the invention to the specific embodiments shown, but are for explanation and understanding only.

FIG. 2A illustrates an example layout of the vertical HVFET structure shown in FIG. 1.

FIG. 2B is an expanded view of one portion of the example layout shown in FIG. 2A.

FIG. 3A illustrates another example layout of the vertical HVFET structure shown in FIG. 1.

FIG. 3B is an expanded view of one portion of the example layout shown in FIG. 3A.

DETAILED DESCRIPTION

In the following description specific details are set forth, such as material types, dimensions, structural features, processing steps, etc., in order to provide a thorough understanding of the present invention. However, persons having ordinary skill in the relevant arts will appreciate that these specific details may not be needed to practice the present invention. It should also be understood that the elements in the figures are representational, and are not drawn to scale in the interest of clarity.

Figure 1:
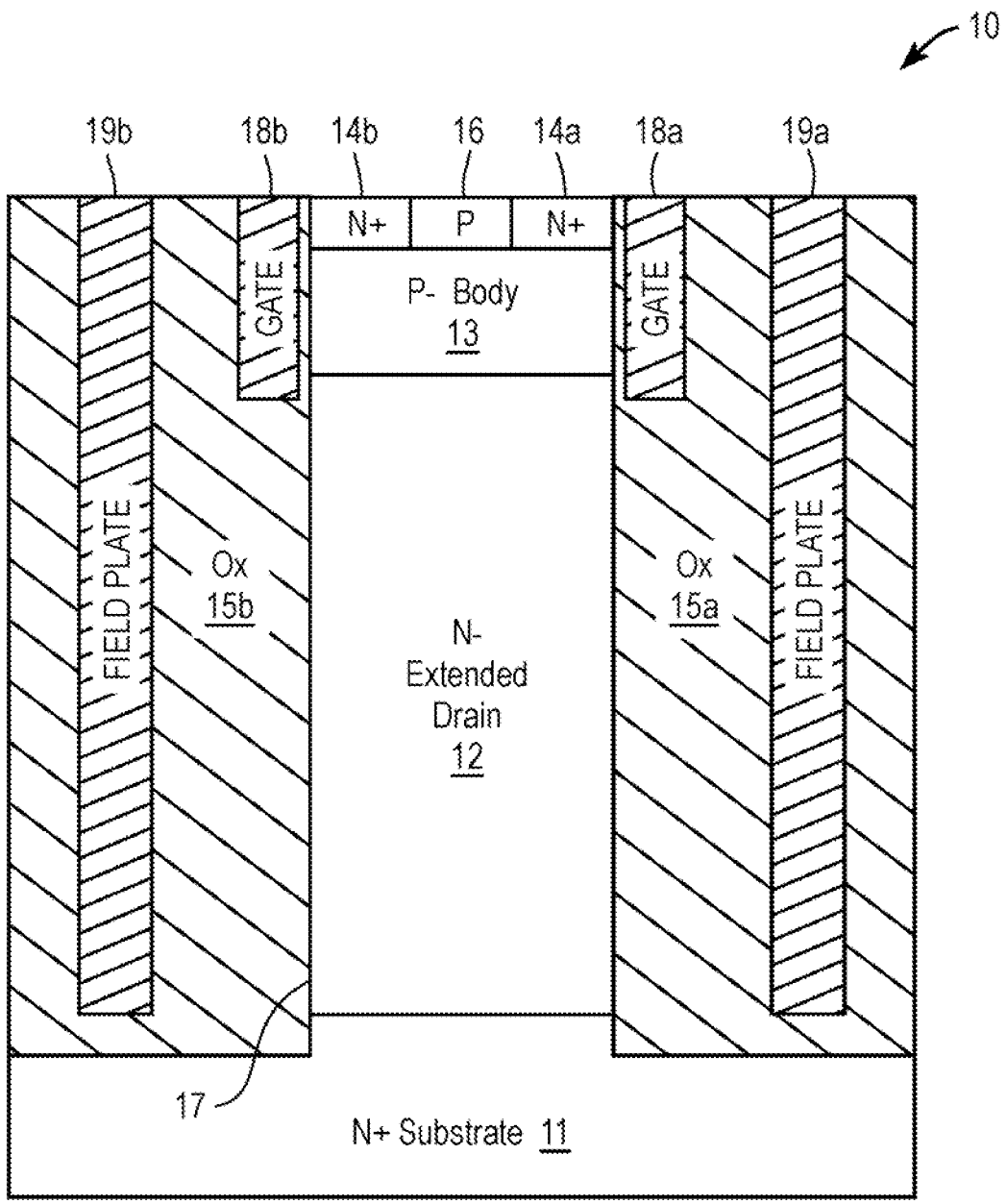
FIG. 1 illustrates an example cross-sectional side view of a vertical HVFET structure.

FIG. 1 illustrates an example cross-sectional side view of a vertical HVFET 10 having a structure that includes an extended drain region 12 of N-type silicon formed on an N+ doped silicon substrate 11. Substrate 11 is heavily doped to minimize its resistance to current flowing through to the drain electrode, which is located on the bottom of the substrate in the completed device. In one embodiment, extended drain region 12 is part of an epitaxial layer that extends from substrate 11 to a top surface of the silicon wafer. A P-type body region 13 and N+ doped source regions 14a & 14b laterally separated by a P-type region 16, are formed near a top surface of the epitaxial layer. As can be seen, P-type body region 13 is disposed above and vertically separates extended drain region 12 from N+ source regions 14a & 14b and P-type region 16.

In one embodiment, the doping concentration of the portion of epitaxial layer which comprises extended drain region 12 is linearly graded to produce an extended drain region that exhibits a substantially uniform electric-field distribution. Linear grading may stop at some point below the top surface of the epitaxial layer 12.

Extended drain region 12, body region 13, source regions 14a & 14b and P-type region 16 collectively comprise a mesa or pillar 17 (both terms are used synonymously in the present application) of silicon material in the example vertical transistor of FIG. 1. Vertical trenches formed on opposite sides of pillar 17 are filled with a layer of dielectric material (e.g., oxide) that makes up dielectric region 15. The height and width of pillar 17, as well as the spacing between adjacent vertical trenches may be determined by the breakdown voltage requirements of the device. In various embodiments, mesa 17 has a vertical height (thickness) in a range of about 30 µm to 120 µm thick. For example, a HVFET formed on a die approximately 1 mm×1 mm in size may have a pillar 17 with a vertical thickness of about 60 µm. By way of further example, a transistor structure formed on a die of about 2 mm-4 mm on each side may have a pillar structure of approximately 30 µm thick. In certain embodiments, the lateral width of pillar 17 is as narrow as can be reliably manufactured (e.g., about 0.4 µm to 0.8 µm wide) in order to achieve a very high breakdown voltage (e.g., 600-800V).

In another embodiment, instead of arranging P-type region 16 between N+ source regions 14a & 14b across the lateral width of pillar 17 (as shown in FIG. 1), N+ source regions and P-type regions may be alternately formed at the top of pillar 17 across the lateral length of pillar 17. In other words, a given cross-sectional view such as that shown in FIG. 1 would have either an N+ source region 14, or a P-type region 16, that extends across the full lateral width of pillar 17, depending upon where the cross-section is taken. In such an embodiment, each N+ source region 14 is adjoined on both sides (along the lateral length of the pillar) by P-type regions 16. Similarly, each P-type region 16 is adjoined on both sides (along the lateral length of the pillar) by N+ source regions 14.

Dielectric regions 15a & 15b may comprise silicon dioxide, silicon nitride, or other suitable dielectric materials. Dielectric regions 15 may be formed using a variety of well-known methods, including thermal growth and chemical vapor deposition. Disposed within each of the dielectric layers 15, and fully insulated from substrate 11 and pillar 17, is a field plate 19. The conductive material used to from field plates 19 may comprise a heavily doped polysilicon, a metal (or metal alloys), a silicide, or other suitable materials. In the completed device structure, field plates 19a & 19b normally function as capacitive plates that may be used to deplete the extended drain region of charge when the HVFET is in the off state (i.e., when the drain is raised to a high voltage potential). In one embodiment, the lateral thickness of oxide region 15 that separates each field plate 19 from the sidewall of pillar 17 is approximately 4 82 m.

The trench gate structure of vertical HVFET transistor 80 comprises gate members 18a & 18b, each respectively disposed in oxide regions 15a & 15b on opposite sides of pillar 17 between field plates 19a & 19b and body region 13. A high-quality, thin (e.g., ~500 Å) gate oxide layer separates gate members 18 from the sidewalls of pillar 17 adjacent body region 13. Gate members 18 may comprise polysilicon, or some other suitable material. In one embodiment, each gate member 18 has a lateral width of approximately 1.5 µm and a depth of about 3.5 µm.

Practitioners in the art will appreciate that N+ source regions 14 and P-type body region 13 near the top of pillar 17 may each be formed using ordinary deposition, diffusion, and/or implantation processing techniques. After formation of the N+ source region 38, HVFET 10 may be completed by forming source, drain, gate, and field plate electrodes that electrically connect to the respective regions/materials of the device using conventional fabrication methods (not shown in the figures for clarity reasons).

FIG. 2A illustrates an example layout of the vertical HVFET structure shown in FIG. 1. The top view of FIG. 2A shows a single, discrete HVFET comprising an upper transistor section 30a and a lower transistor section 30b on a semiconductor die 21. The two sections are separated by a dummy silicon pillar 32. Each section 30 comprises a plurality of "racetrack" shaped transistor structures or segments, each transistor segment comprises an elongated ring or oval that includes a silicon pillar 17 surrounded on opposite sides by dielectric regions 15a & 15b. Pillar 17, itself, extends laterally in the x and y directions to form a continuous, elongated, racetrack-shaped ring or oval. Disposed within dielectric regions 15a & 15b are respective gate members 18a & 18b and field plates 19a & 19b. Field plate 19a comprises a single elongated member that terminates on either end in a rounded fingertip area. Field plate 19b, on the other hand, comprises an enlarged ring or oval that encircles pillar 17. Field plates 19b of adjacent racetrack structures are shown merged such that they share a common member on a side. By way of reference, the cross-sectional view of FIG. 1 may be taken through cut lines A-A' of the example layout of FIG. 2A.

It should be understood that in the example of FIG. 2A, each of the racetrack transistor segments has a width (i.e., pitch) in the y-direction of approximately 13 µm, a length in the x-direction in a range of about 400 µm to 1000 µm, with a pillar height of about 60 µm. In other words, the length to width ratio of the individual racetrack transistor segments comprising sections 30a & 30b is in a range of about 30 up to 80. In one embodiment, the length of each racetrack shaped segment is at least 20 times greater than its pitch or width.

Practitioners in the art will appreciate that in the completed device structure, patterned metal layers are used to interconnect each of the silicon pillars 17 of the individual transistor segments. That is, in a practical embodiment, all of the source regions, gate members, and field plates are respectively wired together to corresponding electrodes on the die. In the embodiment shown, the transistor segments in each section 30 are arranged in a side-by-side relationship in the y-direction substantially across a width of die 21. Similarly, in the x-direction the additive length of the transistor segments of sections 30a & 30b extend substantially over the length of die 21. In the example layout of FIG. 2A the width of dielectric regions 15 separating the silicon pillars, as well as the width of the field plates, is substantially uniform across semiconductor die 21. Laying out the transistor segments with uniform widths and separation distances prevents the formation of voids or holes following the processing steps used to conformably deposit the layers that comprise dielectric regions 15 and field plates 19.

FIG. 2B is an expanded view of one portion of the example layout shown in FIG. 2A. For purposes of clarity, only pillars 17 and dielectric regions 15b of each of the transistor segments is represented. Dummy silicon pillar 32 is shown separating the rounded end areas of dielectric regions 15b of respective transistor segment sections 30a & 30b. In other words, the deep vertical trenches that are etched in the semiconductor substrate to define pillars 17 also define dummy silicon pillar 32. In one embodiment, dummy silicon pillar 32 is made to have a width in the x-direction (i.e., that separates the transistor segment sections) that is as small as can be reliably manufactured.

The purpose of segmenting the single die HVFET into sections separated by dummy silicon pillar 32 is to introduce lengthwise (x-direction) stress-relief in the elongated racetrack shaped transistor segments. Segmenting or breaking the transistor device structures into two or more sections relieves mechanical stress across the length of the die. This stress is induced by the oxide regions flanking the pillars and normally concentrates at the rounded ends of each racetrack segment. Relieving mechanical stress by segmenting the transistor device structures into two or more sections thus prevents undesirable warping of the silicon pillars and damage (e.g., dislocations) to the silicon caused by stress.

It is appreciated that a tradeoff exists between the stress relief provided by a highly segmented layout and loss of conduction area. More segmentation results in greater stress relief, but at the expense of conduction area. In general, the greater the vertical height of the pillars and the larger the semiconductor die, the greater the number of transistor sections or segments that will be required. In one embodiment, for a 2 mm×2 mm die with 60 μm high pillars, adequate stress relief is provided in a HVFET with an on-resistance of about 1 ohm utilizing a layout comprising four racetrack transistor sections separated by dummy silicon pillars, each having a pitch (x-direction) of about 13 μm and a length (y-direction) of about 450 μm.

In another embodiment, instead of a dummy pillar of silicon to separate pairs of racetrack transistor segments, each pair being located in a different section, a dummy pillar comprising a different material may be utilized. The material used for the dummy pillar should have a thermal coefficient of expansion close to that of silicon, or sufficiently different from that of the dielectric region so as to relieve the lengthwise stress induced by the dielectric regions flanking the silicon pillars.

FIG. 3A illustrates another example layout of the vertical HVFET structure shown in FIG. 1. FIG. 3B is an expanded view of one portion of the example layout shown in FIG. 3A, just showing pillars 17, oxide region 15b, and an optional dummy silicon pillar 33. Similar to the embodiment of FIGS. 2A & 2B, FIGS. 3A & 3B show a single, discrete HVFET comprising an upper transistor section 30a and a lower transistor section 30b on a semiconductor die 21. But in the example of FIGS. 3A & 3B, the deep vertical trenches filled with oxide regions 15b and field plates 19b of transistor sections 30a and 30b overlap, or are merged, leaving small, diamond-shaped dummy silicon pillars 33 between the segmented transistor sections. In this embodiment, a single dummy pillar is centrally located between the four rounded ends of adjacent pairs of transistor segments over the two sections. In the example shown, for every N (where N is an integer greater than 1) racetrack segments or structures in a section 30 of the transistor comprising die 21, there are a total of N−1 dummy pillars 33.

Figure 4A:
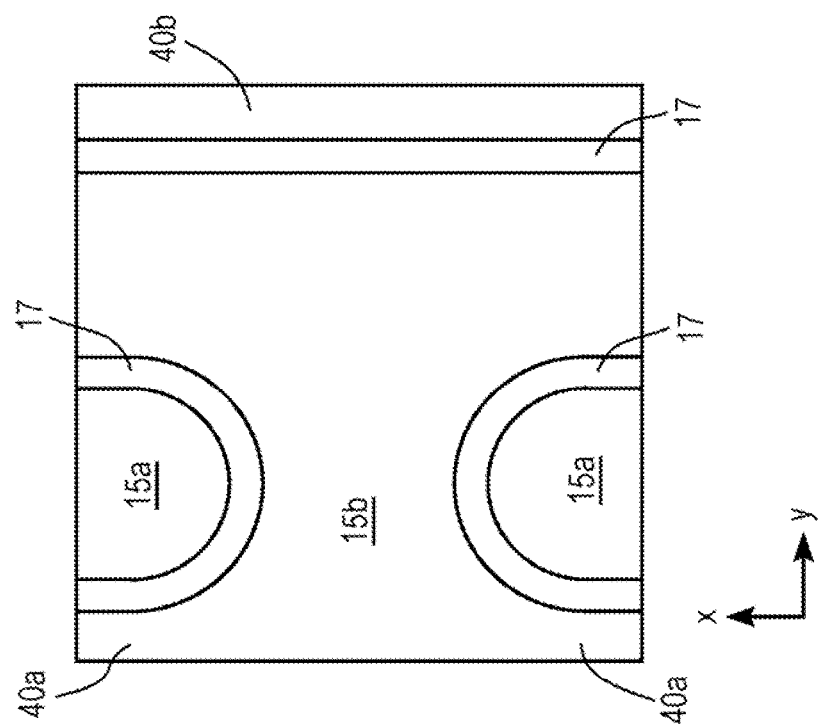
FIG. 4A illustrates yet another example layout of the vertical HVFET structure shown in FIG. 1.
Figure 4B:
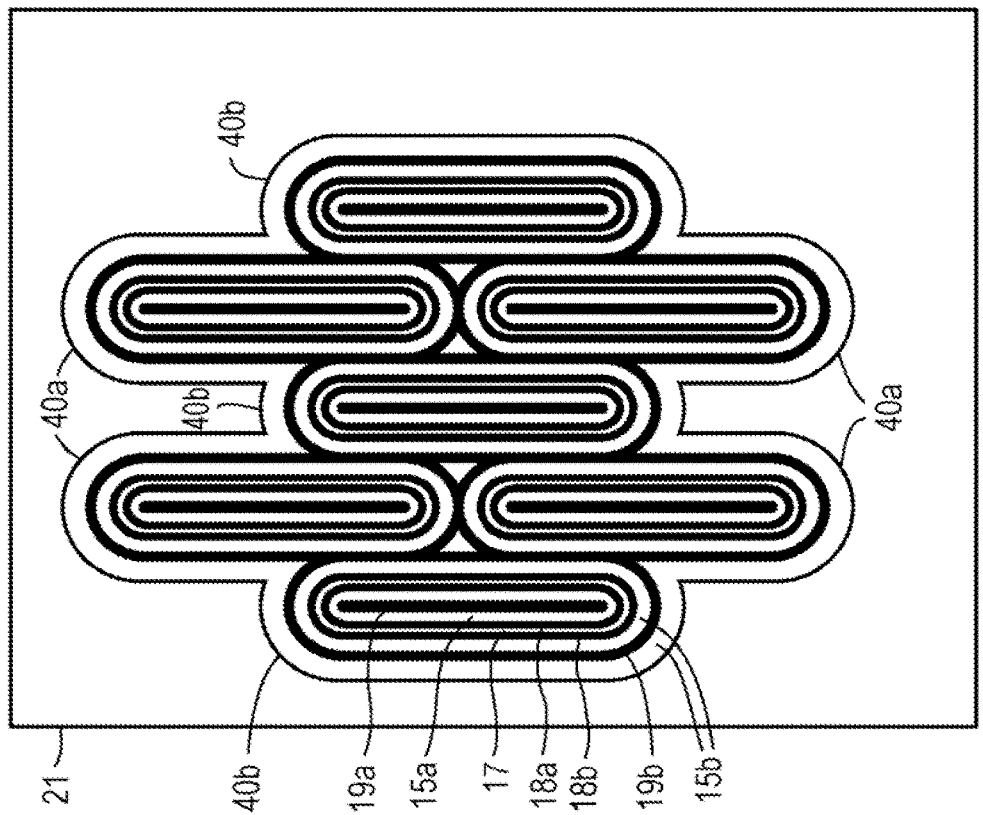
FIG. 4B is an expanded view of one portion of the example layout shown in FIG. 4A.

FIG. 4A illustrates yet another example layout of the vertical HVFET structure shown in FIG. 1. FIG. 4B is an expanded view of one portion of the example layout shown in FIG. 4A. Pillars 17 and oxide region 15b are just shown for clarity reasons in the expanded view of FIG. 4B. In this example, the transistor segments comprising the HVFET of semiconductor die 21 are alternately shifted by half of the length of each racetrack segment, resulting in racetrack transistor segments that are alternately associated with upper transistor section 40a and lower transistor section 40b. In other words, each of the transistor segments of a row of section 40a is separated by a pair of the transistor segments of section 40b, the pair being arranged in an end-to-end relationship in the x-direction.

It is appreciated that the alternate shifting of the segments may be any fraction of the segment length. In other words, shifting of the segments is not limited to 50% or half the length. Various embodiments may comprise segments alternately shifted by any percentage or fraction ranging from greater than 0% to less than 100% of the length of the transistor segments.

In the example of FIGS. 4A & 4B, the dielectric regions 15b of alternating ones of the transistor segments in respective sections 40a & 40b are merged. In the specific embodiment shown, the rounded ends of the transistor segments associated with different adjacent sections overlap or are merged such that field plates 19b of the adjacent sections are merged at the ends (in the x-direction). Also, the extended straight side portions of field plates 19b of alternating transistor segments of different sections are merged along a substantial length of each segment. It is appreciated that regions 15b and 19b may be merged with or without a dummy pillar (or isolated dummy silicon pillars) between the respective sections.

Figure 5:
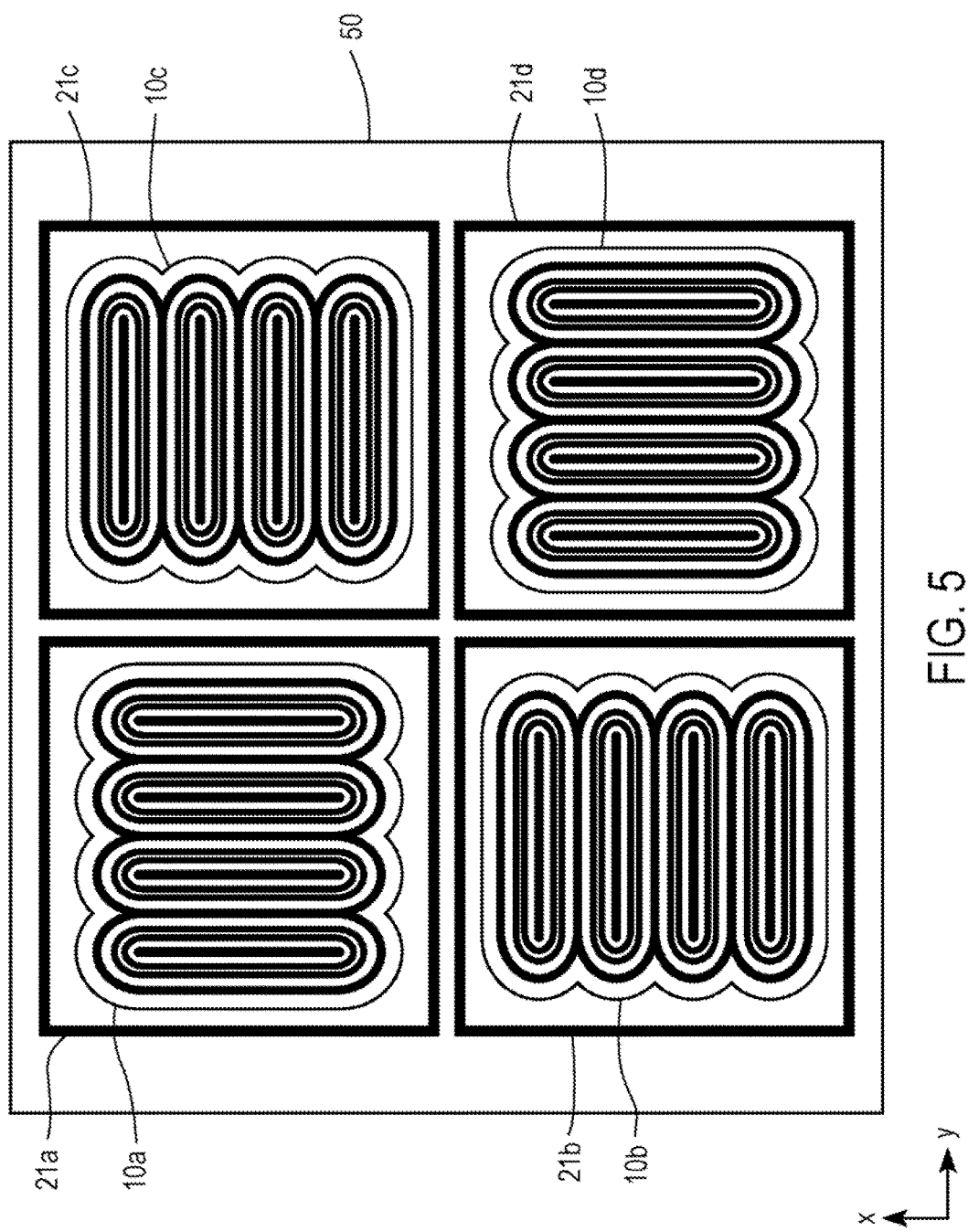
FIG. 5 illustrates an example layout of a wafer with die-to-die checkerboarding of HVFETs.

FIG. 5 illustrates an example layout of a wafer 50 with die-to-die checkerboarding of HVFETs 10a-10d on semiconductor die 21a-21d, respectively. Each of HVFETs 10 comprises a plurality of racetrack-shaped transistor segments such as that shown in FIG. 1, arranged side-by-side along their width into a substantially square block. In this example, HVFETs 10a-10d each comprises transistor segments having a length that extends substantially across the length of the respective die 21a-21d. In one embodiment, the width of each segment is about 13 μm, with the length ranging from about 500 μm to 2000 μm. Other embodiments may have lengths greater than 2000 μm. The block or stacked arrangement of segments also extends substantially across the width of each die. (Note that the bordered square of each die 21 represents the edge of the scribe area between adjacent semiconductor die.) Although FIG. 5 shows two rows and two columns of HVFETs 10 it is appreciated that the die-to-die checkerboarding arrangement shown may be repeated across the entire wafer substrate.

In the example of FIG. 5 adjacent die in a row or a column are oriented such that the length of the transistor segments in one die extends in one direction, with the length of the transistor segments in an adjacent die extending in a second orthogonal direction. For instance, HVFET 10a is shown with the length of its transistor segments oriented in the x-direction, whereas adjacent HVFETs 10b & 10c By orthogonally alternating the orientation of the transistor segments in each individual die 21 across wafer 50 (i.e., checkerboarding) mechanical stress generated by the long dielectric regions is distributed in two orthogonal directions, thus reducing warping of wafer 50.

Figure 6:
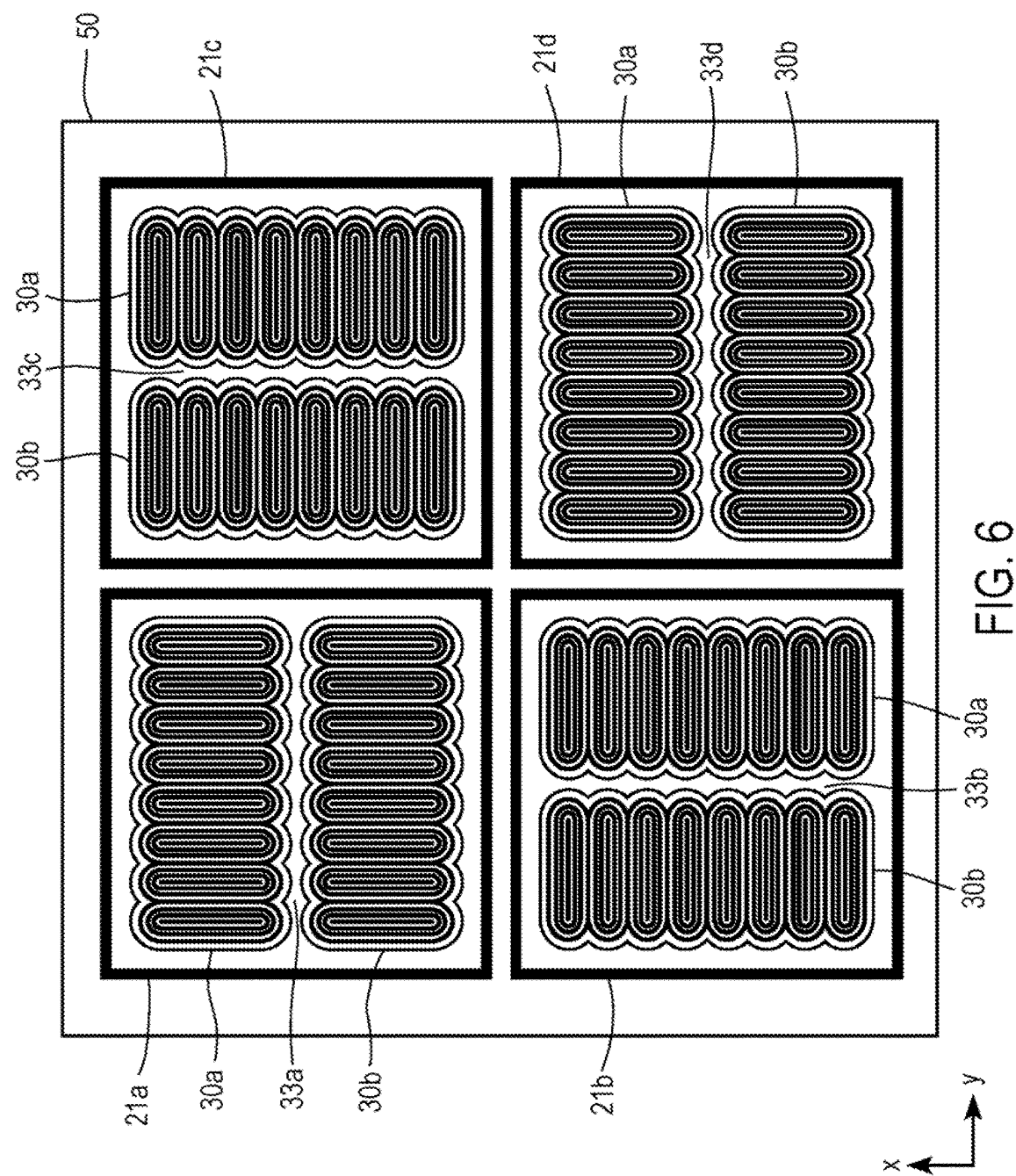
FIG. 6 illustrates an example layout of a wafer with die-to-die checkerboarding of segmented HVFETs.

FIG. 6 illustrates another example layout of a wafer with die-to-die checkerboarding of segmented HVFETs. The example of FIG. 6 utilizes the same approach as in FIG. 5 of alternating the orientation of the transistor structures die-to-die; however, in the embodiment of FIG. 6, the HVFET structures are segmented into multiple (e.g., two) sections. For instance, each HVFET that extends substantially across the length and width of a semiconductor die 21 is segmented into two sections 30a & 30b separated by a dummy pillar 32.

Each of the semiconductor die 21 shown in FIG. 6 has a layout that is the same as that shown in FIG. 2A for a substantially square die. Similar to the example shown in FIG. 5, adjacent die have transistor segments that are orthogonally alternating across wafer 50. That is, the transistor segments in sections 30a & 30b of die 21a and 21d have a length oriented in the x-direction, whereas the transistor segments in sections 30a & 30b of die 21b and 21c have a length oriented in the y-direction.

It is appreciated that the HVFET of each die 21 may be formed with multiple transistor sections, e.g., greater than 2, each separated by one or more dummy pillars. Furthermore, any of the single die layouts with multiple transistor sections shown in the examples of FIGS. 2A-4B may be utilized in each of the die 21 shown in FIG. 6, with the orientation of the segments alternating die-to-die across wafer 50.

Figure 7:
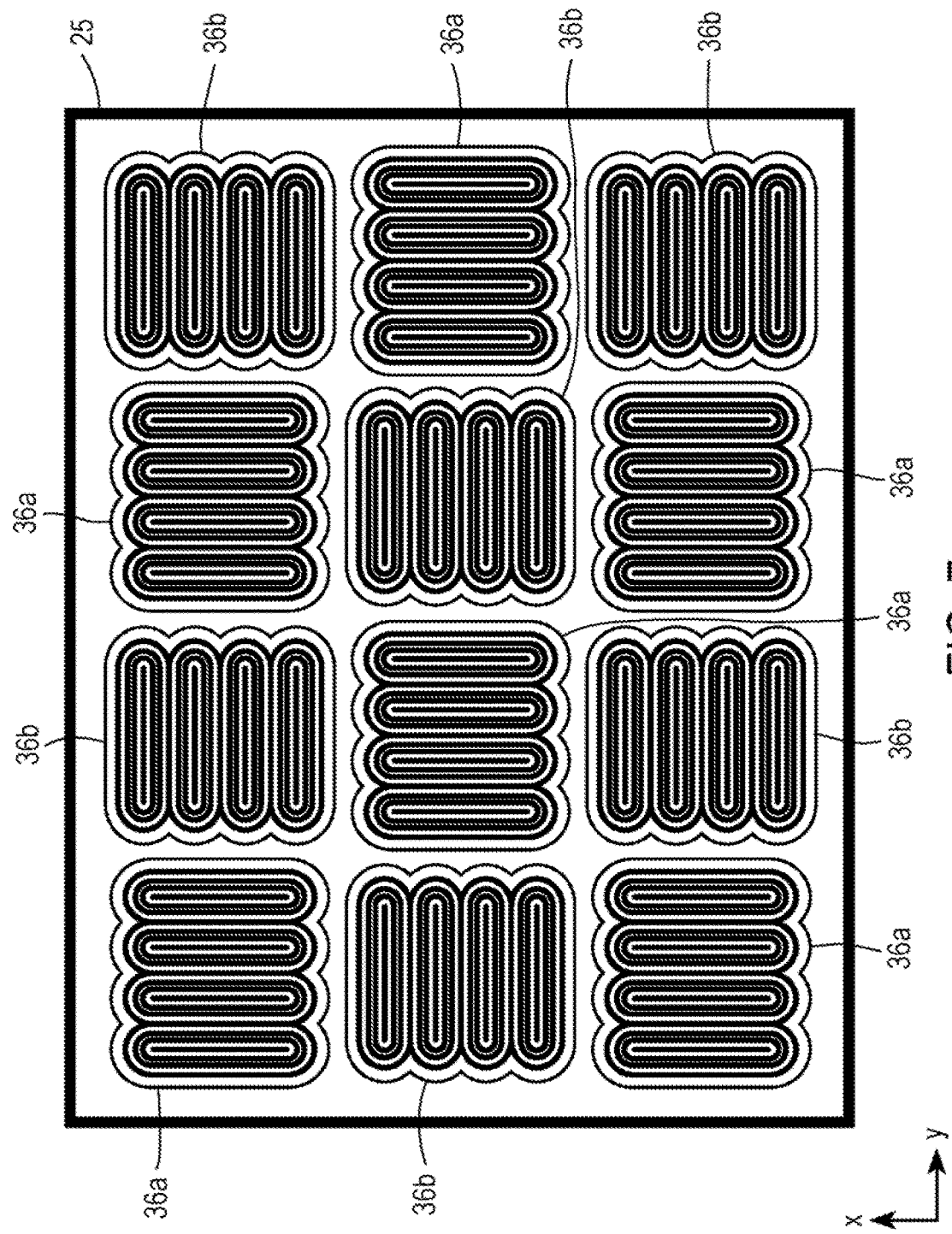
FIG. 7 illustrates an example layout of a rectangular die with checkerboarded blocks of HVFET segments.

FIG. 7 illustrates an example rectangular layout of a die 25 with checkerboarded blocks of racetrack-shaped HVFET segments stacked in a side-by-side arrangement of substantially square blocks or sections 36. Adjacent sections in a row or a column are oriented such that the length of the transistor segments in one section extends in one direction, with the length of the transistor segments in the other adjacent section extending in a second orthogonal direction. For example, each of the rows and columns of die 25 include transistor sections 36a oriented with the elongated transistor segments aligned in the x-direction and alternate transistor sections 36b oriented with the elongated transistor segments aligned in the y-direction. The spaces between sections 36a and 36b comprise dummy silicon pillars; that is, the silicon that forms the dummy pillars is not an active transistor region.

In the embodiment shown, die 25 comprises three rows and four columns of transistor sections 36. The checkerboarded layout approach shown in the example of FIG. 7 may be used to produce a single, discrete HVFET on a die of virtually any (within practical limits) rectilinear-shape.

Figure 8:
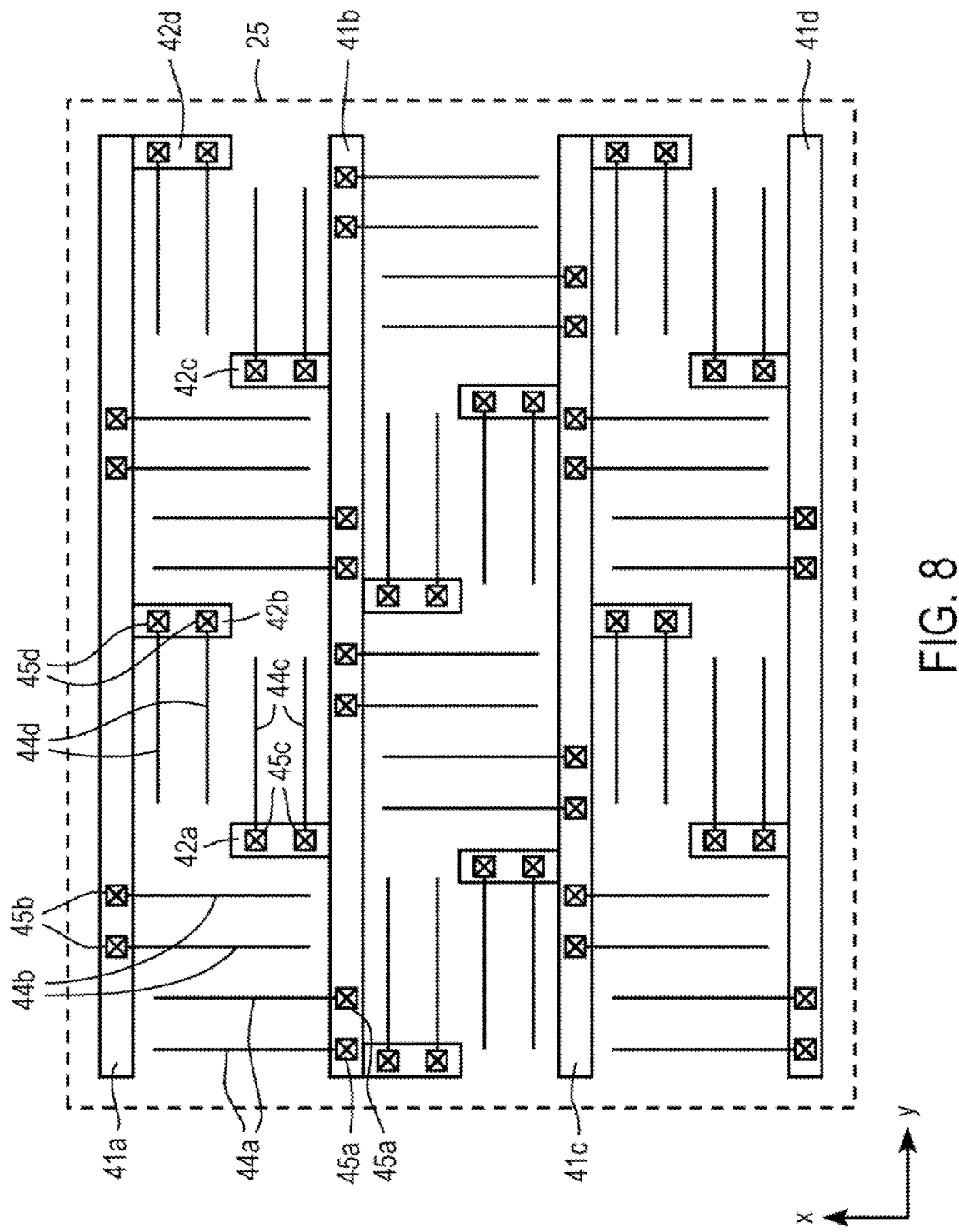
FIG. 8 illustrates an example gate metal routing layout for the die shown in FIG. 7.

FIG. 8 illustrates an example gate metal routing layout for the die shown in FIG. 7. The gate metal routing scheme of FIG. 8 is fabricated using a single metal layer process with both source and gate metal disposed on the same planar level. The example shown includes horizontal gate metal bus lines 41 a-41 d that run between each row of the checkerboarded blocks of racetrack-shaped HVFET segments. For example, gate metal bus lines 41a & 41b are shown extending horizontally along the top and bottom of the first (upper) row of checkerboarded sections 36 of FIG. 7. (It is appreciated that gate metal bus line 41 b may be twice as wide as bus line 41 a due to the face that bus line 41 b provides a shared conduction path to the polysilicon gate members of both the first and second rows of checkerboarded sections.)

Within each row, the sections 36 that have the length of their transistor segments aligned in the x-direction have half of the polysilicon gate members coupled to the top bus line, and a second half of the polysilicon gate members coupled to the bottom bus line. For instance, the upper left-hand block or section 36 in FIG. 8 is shown having the polysilicon gate members represented by lines 44a connected to gate metal bus line 41b via contacts 45a, whereas the polysilicon gate members represented by lines 44b in the same section are connected to gate metal bus line 41a via contacts 45b. Note that each line 44a or 44b actually represents the two gate members 18a & 18b (see FIG. 1) of a single racetrack-shaped HVFET segment. Thus, lines 44a represent the gate members of the two left-most HVFET segments, and lines 44b represent the gate members of the two right-most HVFET segments, in the same section. Note further that each gate member is connected to a bus line (top or bottom) at one end only.

The gate metal routing pattern shown in FIG. 8 also includes vertical gate metal stub lines 42 that extend approximately half-way across each row of checkerboarded blocks. Within each section in which the length of the HVFET segments is aligned in the y-direction, half of the polysilicon gate members are coupled to one stub line, and the other half of the polysilicon gate members are coupled to another stub line. For example, the second section (from the left) in the upper row of FIG. 8 shows a bottom half of the gate members (represented by lines 44c) connected to left-sided gate metal stub line 42a via contacts 45c, with a top half of the gate members (represented by lines 44d) connected to right-sided gate metal stub line 42b via contacts 45d. Similarly, the fourth section (right-hand most) in the upper row of FIG. 8 shows a bottom half of the gate members connected to gate metal stub line 42c and a top half of the gate members connected to gate metal stub line 42d. Note that each gate member of the horizontally-aligned segments is connected to a stub line (left or right side) at one end only.

Figure 9:
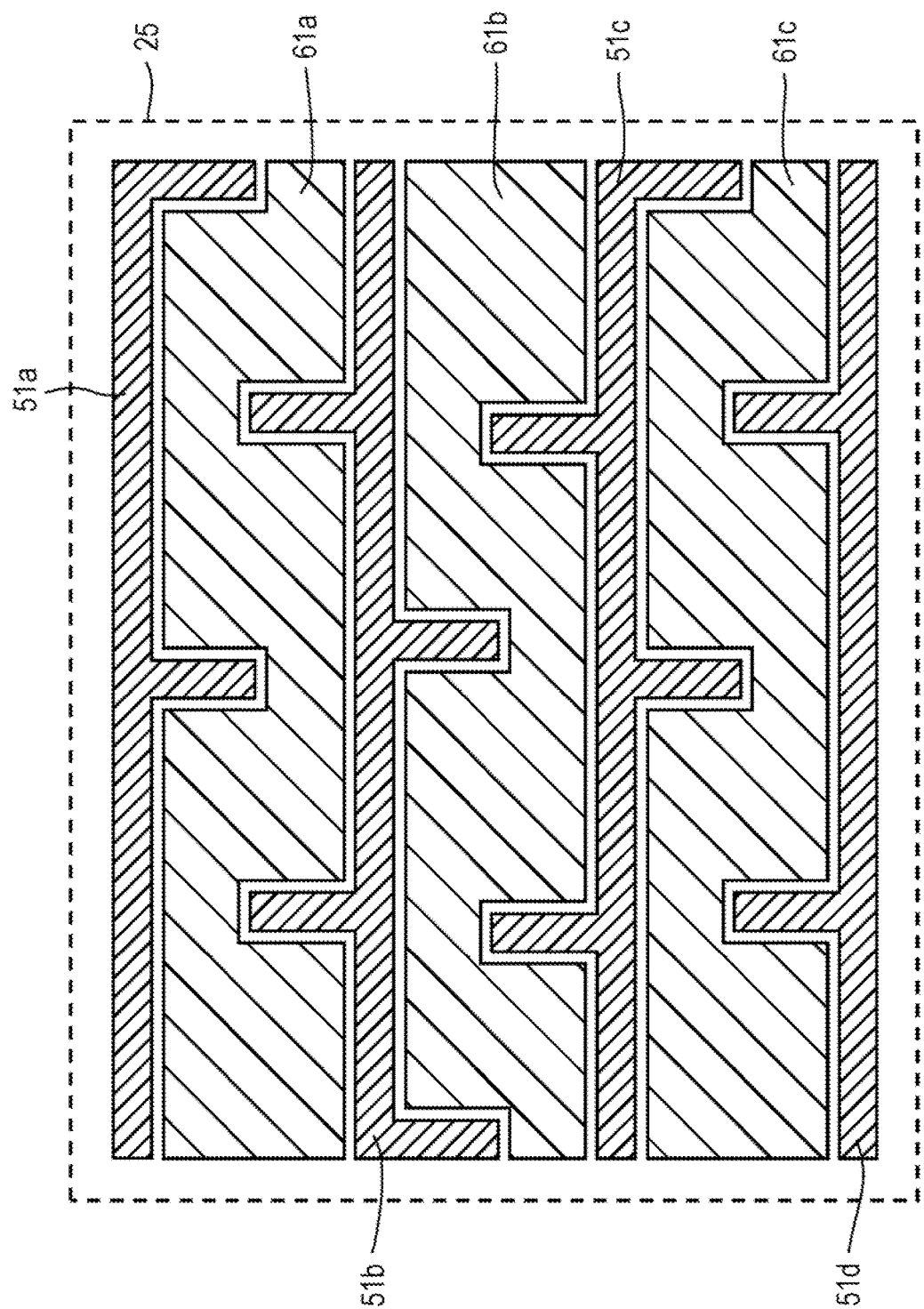
FIG. 9 illustrates an example gate and source metal routing layout for the die shown in FIG. 7.

The reason why gate metal stub lines 42 extend only half-way across those sections having their segments aligned in the y-direction (i.e., horizontally) is to allow the source metal bus lines to extend across each row and contact the source regions of each transistor segment. This is illustrated by the example of FIG. 9, which shows a die 25 having individual source bus lines 61 that extend continuously across each row of transistor sections 36 between top and bottom gate metal traces 51. (Metal traces 51 represent the merged metal bus lines 41 and stub lines 42 associated with each row.) For example, source bus lines 61a runs continuously across the upper row of sections on die 25 to contact each of the source regions 14 at the top of silicon pillars 17 for each HVFET segment in the row. In so doing, source bus lines 61a "snakes" between and around stub lines 42, as well as between bus lines 41, all of which are patterned on the same single layer of metal.

Practitioners in the art will appreciate that by extending stub lines 42 approximately half-way across each row, the current handling capability of each source bus line 61 is maximized (i.e., minimum notching of lines 61). To put it differently, extending stub lines 42 vertically (in the x-direction) a distance other than half-way across each row would unnecessarily constrain or pinch current flow across source bus lines 61 due to the notching of lines 61 around stub lines 42. Likewise, it should be understood that by connecting half of the gate members in a section to one gate metal bus (or stub) line, and the other half to another gate metal bus (or stub) line, electro-migration and resistance problems are minimized.

Figure 10:
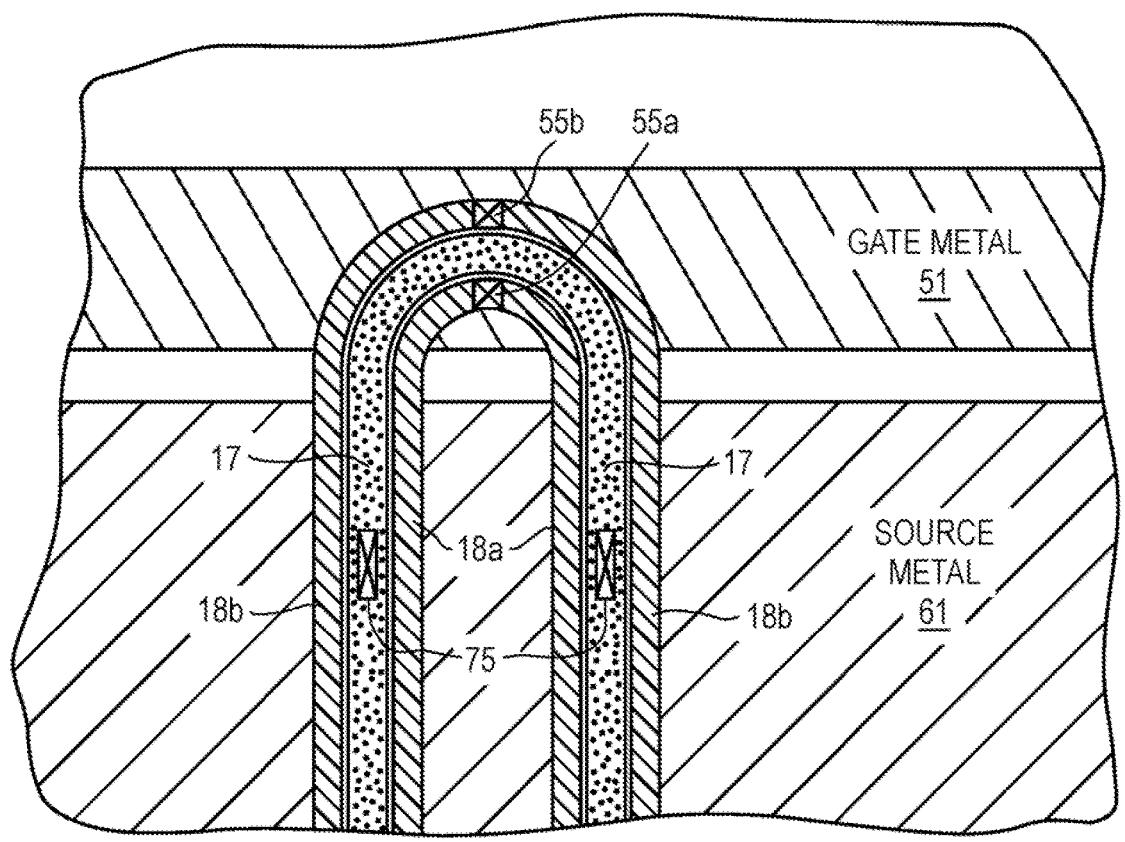
FIG. 10 illustrates an expanded portion of the example layout shown in FIG. 9.

FIG. 10 illustrates an expanded portion of the example layout shown in FIG. 9 that shows one possible scheme for connecting gate metal trace 51 with gate members 18a & 18b. In this example, via contacts 55a & 55b are shown connecting trace 51 with the rounded fingertip portion of gate members 18a & 18b, respectively. The source region at the top of pillar 17 located between gate members 18a & 18b is shown connected to source metal bus 61 via contacts 75. (It is appreciated that only two contacts 75 are shown for clarity reasons.) In an alternative embodiment, rather than contacting the rounded fingertip portion of gate members, gate metal trace 51 may connect along the straight, linear portion of gate members 18a & 18b near the rounded fingertip portion. (Note that the field plates are not shown in the example of FIG. 10 for clarity reasons.)

Figure 11:
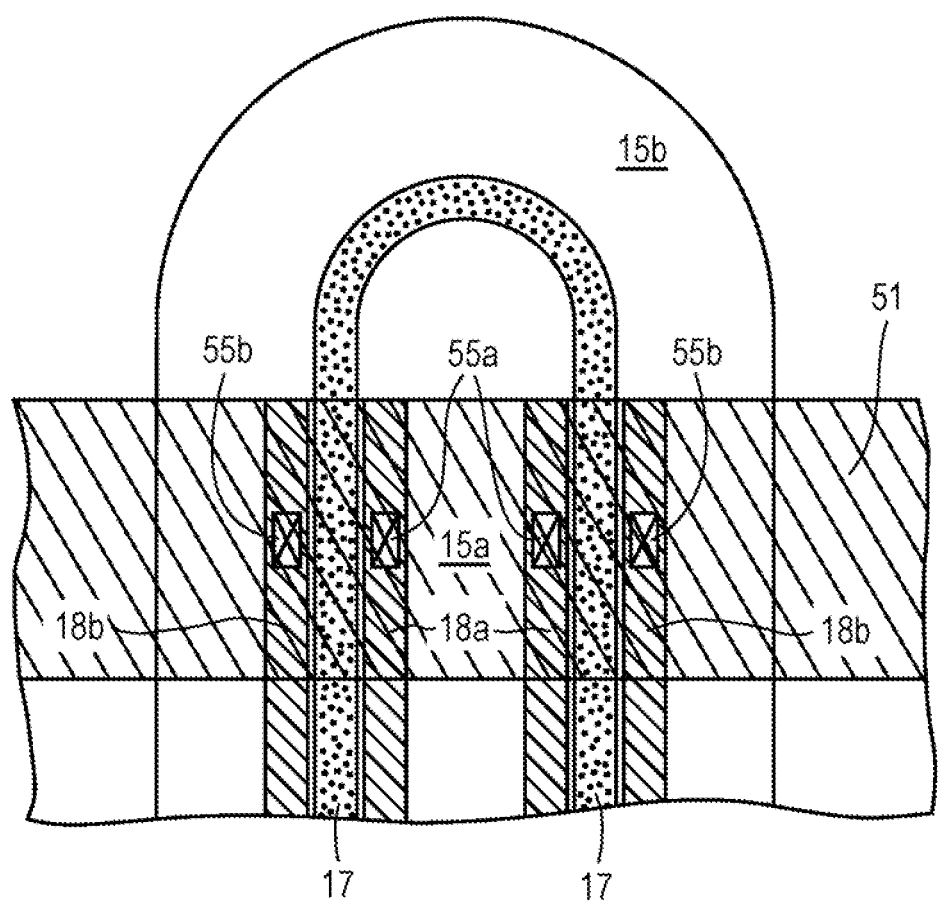
FIG. 11 illustrates an example layout of the rounded end portion of a single HVFET segment having a structure as shown in FIG. 1.

FIG. 11 illustrates an example layout of the rounded end portion of a single HVFET segment having a structure as shown in FIG. 1. In the embodiment shown, the gate members 18a & 18b have been eliminated from the rounded end or fingertip portion of the HVFET segment. In other words, each of the polysilicon gate members 18a & 18b extend laterally along the full length of the HVFET segment on opposite sides of the two substantially linear portions of pillar 17, but terminate at or near the point where pillar begins to curve around at the end portion of the segment. The rounded end of racetrack shaped pillar 17 is adjoined or flanked on opposite sides by dielectric regions 15, with the gate members being completely removed in the area around the end of pillar 17. That is, the embodiment of FIG. 11 includes four separate gate members: one pair being disposed in the dielectric regions 15 on opposite sides of one linear portion of pillar 17, and a second pair being disposed in the dielectric regions 15 on opposite sides of the other linear portion of pillar 17.

In the example of FIG. 11, gate metal bus 51 is shown electrically connected with gate members 18a & 18b via contacts 55a & 55b, respectively, located near the ends of the gate members.

Figure 12:
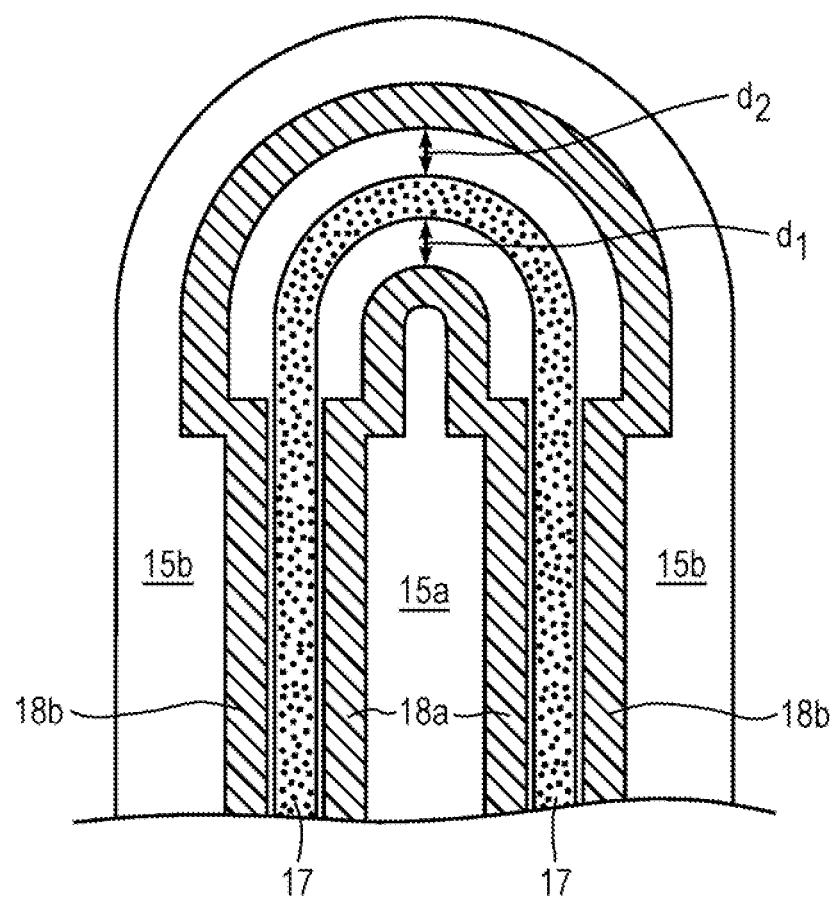
FIG. 12 illustrates another example layout of the rounded end portion of a single HVFET segment having a structure as shown in FIG. 1.

FIG. 12 illustrates another example layout of the rounded end portion of a single HVFET segment having a structure as shown in FIG. 1. In this embodiment, the gate members are shown moved back from pillar 17 along the rounded end portion of the silicon pillar. For example, polysilicon gate members 18a & 18b are shown being pulled back distances of $d_1$ & $d_2$, respectively, along the opposite sides of pillar 17 at the rounded end portion of the HVFET segment. The gate oxide is therefore much thicker (e.g., 1 μm) in the rounded or curved portion of the end termination structure. It is appreciated that the distances $d_1$ & $d_2$ are typically selected to be sufficiently large in order to eliminate gate oxide weakness in the rounded portion of the layout while maintaining adequate distance of gate members 18a & 18b from the respective field plates (not shown) disposed in dielectric regions 15a & 15b. Electrical contact of the rounded fingertip portion of gate members 18a & 18b to the gate metal trace/bus may be made as shown in FIG. 10 or FIG. 11.

Although the above embodiments have been described in conjunction with a specific device types, those of ordinary skill in the arts will appreciate that numerous modifications and alterations are well within the scope of the present invention. For instance, although HVFETs have been described, the methods, layouts and structures shown are equally applicable to other structures and device types, including Schottky, diode, IGBT and bipolar structures. Accordingly, the specification and drawings are to be regarded in an illustrative rather than a restrictive sense.

We claim:

1. A high-voltage transistor device comprising:
a plurality of transistor segments, each transistor segment being arrange on a die in an annular layout, each transistor segment including:
a pillar of semiconductor material having the annular layout with a length elongated in a first lateral direction and a width in a second lateral direction substantially orthogonal to the first lateral direction, the pillar having first and second substantially linear portions that extend in the first lateral direction and first and second rounded end portions that connect the first and second substantially linear portions at respective opposite ends, the pillar including a source region disposed at or near a surface of the pillar, a drift region that extends in a vertical direction through the die, and a body region that separates the source region from the drift region;
first and second dielectric regions disposed on opposite sides of the pillar, respectively, the first dielectric region being laterally surrounded by the pillar, and the second dielectric region laterally surrounding the pillar;
first and second gate members respectively disposed in the first and second dielectric regions at or near a top of the pillar, the first and second gate member being disposed on opposite sides of the pillar, the first and second gate members being separated from the first and second substantially linear portions of the pillar by a gate oxide having a first thickness, the first and second gate members being respectively separated from the pillar by second and third thicknesses of the gate oxide at the first and second rounded portions, the second and third thicknesses being substantially larger than the first thickness.

2. The high-voltage transistor device of claim 1 wherein the first thickness is approximately 500 Å and the second and third thicknesses are both approximately 1 μm.

3. The transistor of claim 1 further comprising first and second field plates respectively disposed in the first and second dielectric regions, the first and second gate members being completely insulated from the first and second field plates.

4. The transistor of claim 1 further comprising a gate metal bus that extends in the second lateral direction orthogonal to the first lateral direction, the gate metal bus being electrically connected to the first and second gate members.

5. The high-voltage transistor of claim 1 wherein the annular layout of the pillar forma a racetrack-shaped ring or oval.

6. The high-voltage transistor of claim 1 wherein the second and third thicknesses are substantially equal.

* * * * *